United States Patent
Wang

(10) Patent No.: US 8,828,849 B2
(45) Date of Patent: *Sep. 9, 2014

(54) PRODUCTION OF SINGLE-CRYSTAL SEMICONDUCTOR MATERIAL USING A NANOSTRUCTURE TEMPLATE

(75) Inventor: Wang Nang Wang, Bath (GB)

(73) Assignee: Nanogan Limited, Bath (GB)

( * ) Notice: Subject to any disclaimer, the term of this patent is extended or adjusted under 35 U.S.C. 154(b) by 505 days.
This patent is subject to a terminal disclaimer.

(21) Appl. No.: 12/307,266

(22) PCT Filed: Jan. 17, 2008

(86) PCT No.: PCT/GB2008/050032
§ 371 (c)(1),
(2), (4) Date: Dec. 31, 2008

(87) PCT Pub. No.: WO2008/087452
PCT Pub. Date: Jul. 24, 2008

(65) Prior Publication Data
US 2009/0174038 A1 Jul. 9, 2009

(30) Foreign Application Priority Data

Jan. 19, 2007 (GB) .................................. 0701069.7
Apr. 30, 2007 (GB) .................................. 0708282.9

(51) Int. Cl.
*H01L 21/36* (2006.01)
*H01L 29/15* (2006.01)
*C30B 25/00* (2006.01)
*C30B 29/40* (2006.01)
*C30B 25/18* (2006.01)
*C30B 25/04* (2006.01)
*C30B 29/16* (2006.01)
*C30B 29/36* (2006.01)
*C30B 25/02* (2006.01)
*C30B 29/48* (2006.01)
*C30B 29/60* (2006.01)

(52) U.S. Cl.
CPC ............... *C30B 25/00* (2013.01); *C30B 29/403* (2013.01); *C30B 25/18* (2013.01); *C30B 29/40* (2013.01); *C30B 25/04* (2013.01); *C30B 29/16* (2013.01); *C30B 29/36* (2013.01); *C30B 25/02* (2013.01); *C30B 29/48* (2013.01); *C30B 29/406* (2013.01); *C30B 29/60* (2013.01)
USPC ...... 438/478; 438/481; 257/76; 257/E21.133; 257/E29.089

(58) Field of Classification Search
CPC ........ C03B 25/18; C03B 29/16; C03B 29/36; C03B 29/40; C03B 29/403; C03B 29/406; C03B 29/48; C03B 29/60
USPC ......... 977/815–816, 762, 891, 893, 763, 887; 438/481, 604, 606, 607, 41, 44, 478; 257/76, E21.133, E29.089
See application file for complete search history.

(56) References Cited

U.S. PATENT DOCUMENTS 6,051,849 A 4/2000 Davis et al.
6,121,121 A 9/2000 Koide
(Continued)

FOREIGN PATENT DOCUMENTS

EP 1246233 A2 10/2002
EP 1276140 A2 1/2003
(Continued)

OTHER PUBLICATIONS

International Search Report dated Apr. 24, 2007 for National application No. GB0701069.7, 2 sheets.
(Continued)

*Primary Examiner* — Jose R Diaz
(74) *Attorney, Agent, or Firm* — Christie, Parker & Hale, LLP

(57) ABSTRACT

A method of producing single-crystal semiconductor material comprises: providing a template material; creating a mask on top of the template material; using the mask to form a plurality of nanostructures in the template material; and growing the single-crystal semiconductor material onto the nanostructures.

24 Claims, 9 Drawing Sheets

MOVPE - Nano-ELOG lateral growth — Al₂O₂ substrate

MOVPE - Nano-ELOG coalescence — Al₂O₂ substrate

HVPE - bulk over-growth — Al₂O₂ substrate

(56) References Cited

U.S. PATENT DOCUMENTS

| | | | |
|---|---|---|---|
| 6,130,142 A * | 10/2000 | Westwater et al. | 438/478 |
| 6,177,688 B1 | 1/2001 | Linthicum et al. | |
| 6,261,929 B1 | 7/2001 | Gehrke et al. | |
| 6,306,734 B1 * | 10/2001 | Givargizov | 438/478 |
| 6,348,096 B1 | 2/2002 | Sunakawa et al. | |
| 6,521,514 B1 | 2/2003 | Gehrke et al. | |
| 6,545,300 B2 | 4/2003 | Gehrke et al. | |
| 6,596,079 B1 | 7/2003 | Vaudo et al. | |
| 6,596,377 B1 | 7/2003 | Hersee et al. | |
| 6,692,568 B2 | 2/2004 | Cuomo et al. | |
| 6,709,513 B2 | 3/2004 | Fukunaga et al. | |
| 6,835,246 B2 | 12/2004 | Zaidi | |
| 6,844,569 B1 | 1/2005 | Lee et al. | |
| 6,897,483 B2 | 5/2005 | Zheleva et al. | |
| 6,901,194 B2 | 5/2005 | Charlton et al. | |
| 6,958,254 B2 | 10/2005 | Seifert | |
| 7,052,979 B2 | 5/2006 | Nagai et al. | |
| 7,115,486 B2 | 10/2006 | Tadatomo et al. | |
| 7,176,497 B2 | 2/2007 | Koide | |
| 7,361,522 B2 * | 4/2008 | Wang et al. | 438/47 |
| 7,521,274 B2 * | 4/2009 | Hersee et al. | 438/41 |
| 7,670,933 B1 * | 3/2010 | Wang et al. | 438/481 |
| 7,772,595 B2 | 8/2010 | Guo et al. | |
| 7,850,941 B2 * | 12/2010 | Tsakalakos et al. | 423/445 R |
| 8,118,934 B2 * | 2/2012 | Wang | 117/94 |
| 2001/0005581 A1 | 6/2001 | Grant et al. | |
| 2001/0055881 A1 | 12/2001 | Laermer et al. | |
| 2002/0013036 A1 | 1/2002 | Gehrke et al. | |
| 2002/0013042 A1 | 1/2002 | Morkoc | |
| 2002/0043208 A1 | 4/2002 | Biwa et al. | |
| 2002/0111044 A1 | 8/2002 | Linthicum et al. | |
| 2003/0006211 A1 | 1/2003 | Fukunaga et al. | |
| 2003/0178634 A1 | 9/2003 | Koide | |
| 2004/0077156 A1 | 4/2004 | Tsakalakos et al. | |
| 2004/0123796 A1 | 7/2004 | Nagai et al. | |
| 2004/0137732 A1 | 7/2004 | Frayssinet et al. | |
| 2004/0157358 A1 | 8/2004 | Hiramatsu et al. | |
| 2004/0206299 A1 | 10/2004 | Tadatomo et al. | |
| 2004/0251519 A1 | 12/2004 | Sugahara et al. | |
| 2005/0037916 A1 * | 2/2005 | Chen et al. | 502/101 |
| 2005/0199886 A1 | 9/2005 | Yi et al. | |
| 2006/0091408 A1 | 5/2006 | Kim et al. | |
| 2006/0144812 A1 * | 7/2006 | Imada et al. | 216/22 |
| 2006/0151797 A1 | 7/2006 | Park | |
| 2006/0246722 A1 | 11/2006 | Speck et al. | |
| 2006/0270087 A1 | 11/2006 | Imer et al. | |
| 2006/0270201 A1 | 11/2006 | Chua et al. | |
| 2007/0152353 A1 | 7/2007 | Park | |
| 2007/0166862 A1 * | 7/2007 | Kim et al. | 438/42 |
| 2008/0054292 A1 | 3/2008 | Guo et al. | |
| 2008/0305568 A1 | 12/2008 | Huang et al. | |
| 2009/0079034 A1 | 3/2009 | Wang | |
| 2009/0079035 A1 | 3/2009 | Wang | |
| 2009/0243043 A1 | 10/2009 | Wang | |
| 2009/0263925 A1 | 10/2009 | Kunisato et al. | |
| 2010/0035416 A1 | 2/2010 | Chen et al. | |
| 2010/0075468 A1 | 3/2010 | Dubrow et al. | |
| 2010/0140745 A1 | 6/2010 | Khan et al. | |
| 2010/0283064 A1 | 11/2010 | Samuelson et al. | |

FOREIGN PATENT DOCUMENTS

| | | |
|---|---|---|
| EP | 1422748 A1 | 5/2004 |
| JP | 2005136106 | 10/2003 |
| JP | 2004 059325 | 2/2004 |
| JP | 2005 314121 | 11/2005 |
| WO | WO 99/19546 | 4/1999 |
| WO | WO 02/44444 A1 | 6/2002 |
| WO | WO 2006/060599 A2 | 6/2006 |
| WO | WO 2007/107757 A2 | 9/2007 |
| WO | WO 2008/087452 A1 | 7/2008 |
| WO | WO 2008/096168 A1 | 8/2008 |

OTHER PUBLICATIONS

International Search Report dated Sep. 7, 2007 for National application No. GB0708282.9, 2 sheets.
International Search Report dated May 6, 2008 for International application No. PCT/GB2008/050032, 4 sheets.
International Search Report dated Jul. 11, 2006 for International application No. GB0605838.2 (1 page).
International Search Report dated Sep. 14, 2007 for PCT application No. PCT/GB2007/001011 (4 pages).
Hung et al., "Shell buckling behavior investigation of individual gallium nitride hollow nanocolumn," Applied Physics A, Materials Science & Processing, 2006, vol. 84, pp. 439-443.
Wagner et al., "Growth and characterization of pendeo-epitaxial GaN (1 1 20) on 4H-SiC(1 1 20) substrates," Journal of Crystal Growth, 2006, vol. 290, pp. 504-512.

* cited by examiner

GaN Nano-columns
(removing any SiO$_2$
prior to processing)

Coating with SiN

GaN column tops
revealed for
seeding

MOVPE - Nano-ELOG
lateral growth

MOVPE - Nano-ELOG
coalescence

HVPE - bulk over-growth

PRODUCTION OF SINGLE-CRYSTAL SEMICONDUCTOR MATERIAL USING A NANOSTRUCTURE TEMPLATE

CROSS-REFERENCE TO RELATED APPLICATION

The present application is the National Stage of International Application No. PCT/GB2008/050032, filed Jan. 17, 2008, which claims the benefit under 35 U.S.C. §119 of United Kingdom Application No. 0701069.7, filed Jan. 19, 2007 and United Kingdom Application No. 0708282.9, filed Apr. 30, 2007, both of which are incorporated herein by reference in their entirety.

FIELD OF THE INVENTION

The present invention relates to methods of producing a single-crystal semiconductor material and creating semiconductor nanostructures, and the materials thus produced.

BACKGROUND

Wide band-gap GaN and related materials are recognized to be among the most attractive compound semiconductors for use in a variety of devices. They are adapted for optoelectronic and microelectronic devices which operate in a wide spectral range, from visible to ultraviolet and in the high temperature/high power applications area. The main advantages of nitride semiconductors in comparison with other wide-band-gap semiconductors is their low propensity to degrade at high temperature and high power when used for optical and microelectronic devices. Meanwhile, low-dimensional quantum confinement effects (i.e. in quantum wires and dots) are expected to become one of the foremost technologies for improving optical device performances. Fabrication of a variety of low-dimensional structures in III-V nitrides has been undertaken using methods such as etching, re-growth, overgrowth on selected areas, growth on tilted substrates, self-organization process, etc.

Despite the technological advances of the last few years, one of the key obstacles preventing further developments in GaN devices is the lack of high quality and commercially available low-cost, free-standing GaN substrates. Alternative substrates, such as sapphire and SiC, are commonly employed in nitride-based devices. As a result of lattice mismatch and large differences in the thermal expansion coefficients between the deposited film and substrate (heteroepitaxy), a very high ($10^9$ to $10^{10}$ $cm^{-2}$) density of threading dislocations and serious wafer bending/cracking, induced by undesired residual strain, occurs in the grown nitride layers. These factors can significantly affect the performance and lifetime of nitride-based optoelectronic and microelectronic devices.

Epitaxial lateral overgrowth technique (so-called ELOG and its modifications: facet initiated epitaxial lateral overgrowth (FIELO) and Pendeo (from the Latin to hang or be suspended)) is the most widely used approach employed for suppressing bending and a significant fraction of the threading dislocations in the material. Laterally overgrowing oxide (or metal) stripes deposited on initially-grown GaN films has been shown to achieve about two orders of magnitude reduction in the dislocation density, reducing it to the $10^7$ $cm^{-2}$ level. However, the low defect-density material only occurs in the wing region, located in the coalescence front, and represents only approximately one fifth of the whole wafer surface area. Large coalescence front tilting and tensile stress are both present in the overgrowth region.

Low defect-density free standing GaN is currently one of the materials of choice to achieve the desired specification for optoelectronic and microelectronic devices. Bulk (melt or sublimation) and hydride vapour phase epitaxy (HVPE) are the two main techniques for growing free standing and low defect-density GaN. Bulk GaN growth techniques operating at a very high pressure of ~15 kbar have been successful in growing low dislocation density ($<10^7$ $cm^{-2}$) material. Unfortunately, this technology suffers from a low growth rate and is limited to small diameter substrates, making them very expensive and uneconomic for commercial manufacturing. The record nitride laser lifetime of 15,000 hours under CW-operation at the 30 mW output level has recently been demonstrated by Nichia Chemicals Inc., using the HVPE grown substrate. HVPE is clearly one of the most promising techniques available to provide low defect-density GaN and large diameter commercial free-standing GaN substrates.

HVPE is a reversible equilibrium-based hot wall process with several advantages: (1) high growth rate (up to 100 μm/hr—more than 100 times faster than that of the MOCVD and MBE methods; (2) low running costs; (3) the mutual annihilation of mixed dislocations lowers the defect densities in thick GaN. However, the HVPE technique still has the same inherent problems due to its growth on foreign substrates. Therefore, the growth of thick GaN using HVPE in general has to overcome two critical issues; firstly, to reduce the bending and cracking of initial GaN thick films (30-100 μm) on foreign substrates and secondly, to minimize the defect density of GaN.

The cracking of thick GaN film, due to the use of foreign substrates, depends on the growth and cooling conditions. The critical thickness for crack appearance in GaN can be improved from a typical value of 10-15 μm for GaN grown conventionally by the HVPE directly onto sapphire substrates, to 40-80 μm-thick crack-free layers by the use of reactively sputtered AlN buffer layers, or by employing ZnO buffer layers. However, even this thickness is not sufficient for safe handling during substrate separation. To further reduce the cracking in thicker GaN films in the initial growth, other growth techniques such as ELOG, growth on patterned substrates, re-growth with molten Ga interfacial layers, use of substrates better matched to GaN, and the use of thinned and mechanically weakened sapphire substrates have also been exploited.

To reduce defect density (mainly threading dislocations) and strain, and to improve the surface morphology of the thick GaN films grown by HVPE, various techniques have been employed, for example ELOG, growth under lower reactor pressure and growth with TiN intermediate layers, or deep inverse pyramid etch pits on weakened Si, GaAs and other III-V single crystal wafers. However, the growth processes using these techniques are tedious, time consuming and expensive. The GaN thus produced still has the major disadvantages of bending and undesired residual strain.

Various vapour deposition methods suitable for growing GaN materials are described in U.S. Pat. No. 6,413,627, U.S. Pat. No. 5,980,632, U.S. Pat. No. 6,673,149, U.S. Pat. No. 6,616,757, U.S. Pat. No. 4,574,093 and U.S. Pat. No. 6,657,232. Other publications relating to such methods include:
1. Handbook of Crystal Growth, Vol 3, edited by D. T. J. Hurle, Elsevier Science 1994.
2. R. F. Davis et al, ' Review of Pendeo-Epitaxial Growth and Characterization of Thin Films of GaN and AlGaN Alloys on 6H—SiC(0001) and Si(111) Substrates.' MRS Internet J. Nitride Semicond. Res. 6, 14, 1 (2001).

3. M. Yoshiawa, A. Kikuchi, M. Mori, N. Fujita, and K. Kishino, 'Growth of self-organised GaN nanostructures on Al2O3 (0001) by RF-radical source molecular beam epitaxy.' Jpn. J. Appl. Phys., 36, L359 (1997).
4. K. Kusakabe, A. Kikuchi, and K. Kishino, 'Overgrowth of GaN layer on GaN nano-columns by RF-molecular beam epitaxy.' J. Crystl. Growth, 237-239, 988 (2002).
5. J. Su et al, 'Catalytic growth of group III-nitride nanowires and nanostructures by metalorganic chemical vapor deposition.' Appl. Phys. Lett., 86, 13105 (2005).
6. G. Kipshidze et al, 'Controlled growth of GaN nanowires by pulsed metalorganic chemical vapor deposition.' Appl. Phys. Lett., 86, 33104 (2005).
7. H. M. Kim et al, 'Growth and characterization of single-crystal GaN nanorods by hydride vapor phase epitaxy.' Appl. Phys. Lett., 81, 2193 (2002).
8. C. C. Mitchell et al., Mass transport in the epitaxial lateral overgrowth of gallium nitride.' J. Cryst. Growth, 222, 144 (2001).
9. K. Hiramatsu, Epitaxial lateral overgrowth techniques used in group III nitride epitaxy.' J. Phys: Condens, Matter, 13, 6961 (2001).
10. R. P. Strittmatter, 'Development of micro-electromechnical systems in GaN', PhD Thesis, California Institute of Technology, P. 92 (2003).

SUMMARY OF THE INVENTION

The present provides a method of growing high-quality flat and thick compound semiconductors which at least partially overcomes the problems discussed above. In this context, a "thick" semiconductor is one that is substantially self-supporting, typically of thickness greater than about 50 µm.

It has been proposed to grow thick compound semiconductors on top of "nanostructures", i.e. discrete formations of dimensions in the order of nanometers, as in British Patent Application No. 0605838.2. The present invention provides improvements to the methodology proposed in that application, enabling mass-production of the semiconductor material.

In accordance with the present invention there is provided a method of producing single-crystal semiconductor material comprising:
(a) providing a template material;
(b) creating a mask on top of the template material;
(c) using the mask to form a plurality of nanostructures on the template material; and
(d) growing the single-crystal semiconductor material onto the nanostructures.

In accordance with a second aspect of the present invention there is provided a method of creating semiconductor nanostructures, comprising the steps of:
(a) providing a template material;
(b) creating a mask on top of the template material; and
(c) using the mask to form at least one nanostructure on the template material.

In one embodiment, the template material comprises a substrate.

The template material may comprise a layer of semiconductor material.

The template material semiconductor layer may be selected from the group consisting of p-type doped, n-type doped or undoped III-V and II-VI compounds, and metal oxides. The semiconductor layer may comprise a simple layer, or multiple layers, or the heterostructure, or superlattices of the III-V or II-VI compounds. The semiconductor layer may comprise one of AlN, $Al_xGa_{1-x}N$ with $1>x>0$, GaN, or $In_xGa_{1-x}N$ with $1>x>0$.

In this manner, the layer structure template can be made of a simple layer, multiple layers, or of the heterostructure, or of superlattices consisting of n- and p-type doped and un-doped semiconductors such as AlN, $Al_xGa_{1-x}N$ with $1>x>0$, GaN, $In_xGa_{1-x}N$ with $1>x>0$. The total thickness of the grown semiconductor layers is preferably less than 3 µm. Examples of such templates can be substrate/amorphous AlN (~200 to 500 nm)/GaN (50-100 nm), substrate/AlN (~20 nm)/GaN (1-3 µm), substrate/AlN (~20 nm)/AlGaN (1-3 µm)/GaN (10-100 nm), substrate/AlN (~20 nm)/AlGaN (1-3 µm)/InGaN (10-100 nm)/GaN (10-100 nm), substrate/GaN/(AlGaN 2.5-10 nm/GaN 2.5-10 nm superlattices), substrate/GaN/(AlGaN 2.5-10 nm/AlN 2.5-10 nm superlattices)/GaN (10-100 nm), substrate/GaN/(InGaN 2.5-10 nm/GaN 2.5-10 nm superlattices)/GaN (10-100 nm), substrate/$Si_3N_4$/AlN (~20 nm)/GaN (1-3 µm)/p-GaN (10-100 nm).

In another embodiment, the template material may comprise a top layer of p-GaN.

The semiconductor layer may formed by deposition onto the substrate by epitaxial growth methods.

The substrate may comprise a material selected from the group consisting of sapphire, silicon, silicon carbide, diamond, metals, metal oxides, compound semiconductors, glass, quartz and composite materials. The substrate may comprise a single crystal material with a specific crystal orientation, for example m-plane SiC or γ-plane sapphire. The substrate may comprise a material selected from the group consisting of undoped, n-type or p-type materials. The substrate may further be selected from the group consisting of conducting, semiconducting or insulating materials.

In step (b), the mask may be created by depositing a layer of dielectric material onto the template material, i.e. either a semiconductor layer or the substrate. The mask may be formed by imprinting onto the dielectric material using a nano-imprint method. Alternatively, a layer of metal may be applied onto the layer of dielectric material. In this case, the mask may be formed by removing regions of the metal layer.

In step (b), the nano-mask may be created using any available mask-making technology, for example one of metal (for example Ni) annealing, anodic porous alumina, e-Beam lithography, interferometry, holography, photolithography or a nano-imprint method. The mask pattern may be random or predetermined, which will depend on the mask fabrication process used, as outlined below, to achieve desired physical or chemical properties.

In step (c), the nanostructures may be formed by etching the template material, which may be by wet, dry or combined wet and dry etching. The etching may be used to remove part of the substrate, in other words that the depth of etching extends below the upper surface of the substrate. After etching, any remaining metal and/or dielectric material on the nanostructures may be removed.

In a further embodiment, the method includes subjecting the nanostructures to a nitridation process, which may be either in-situ or ex-situ.

Each nanostructure may comprise a nanocolumn, also known as a nano-rod or quantum wire.

Step (d) may comprise laterally growing an initial layer of semiconductor material, then vertically growing the semiconductor material onto the initial layer. The lateral growth of semiconductor material may be carried out by a MOCVD, a MBE, or an HVPE method. The lateral growth may comprise combined low temperature (100-500° C.) and high temperature growth processes (700-1400° C.). Alternatively, the lateral growth of semiconductor material may be carried out by a pulsed growth method.

The vertical growth of semiconductor material may be carried out by an HVPE method.

In an embodiment, in step (d), the growth of semiconductor material is performed while rotating and maintaining the distance between the surface of the template and gas outlets in a growth chamber.

The single-crystal semiconductor material may comprise a different material from the nanostructures.

The semiconductor material may be undoped, or n- or p-type doped.

The semiconductor material may be polar or non-polar, which may depend on the crystal orientation selected for the substrate.

The method may further comprise the step of separating the semiconductor material from the nanostructures. The semiconductor material may be separated from the nanostructures by rapidly cooling the material, or by mechanical separation, wet etching, electrochemical etching or laser ablation. In the case of laser ablation, the laser may be directed toward the substrate-semiconductor material interface from the side of the structure, or alternatively up through the substrate.

The method may further comprise the step of: (f) slicing, grinding, lapping and/or polishing the semiconductor material to a predetermined thickness. The grown compound semiconductor may be sliced to produce a semiconductor layer of pre-selected thickness. The wafer produced in such manner can be used as the seed material for the further thick growth of compound semiconductors.

The template material may comprise a semiconductor material previously produced by the method.

In accordance with a third aspect of the present invention there is provided a single-crystal semiconductor material grown using the method according to the first aspect.

In accordance with a fourth aspect of the present invention there is provided a semiconductor nanostructure formed by a method according to the first or second aspects.

As mentioned above, the mask (also termed a "nano-mask" due to the dimensions involved) can be produced by a metal annealing method, the anodic porous alumina method, e-Beam lithography, interferometry, holography, photolithography, nano-imprint or any other suitable method.

The pattern of nanostructures formed may either by random or pre-determined depending on the process employed. For example, the annealing method would produce a random pattern of nano-structures. The anodic alumina method may produce both random and determined hexagonal patterns depending on the stress of the processes used, e.g. whether or not a pre-indentation mark is used. Photolithography, interferometry and nano-imprinting can all produce custom patterns. Nano-imprinting can also produce a random pattern if the masks used are based on annealed metals such as Ni.

Metal annealing nano-mask fabrication processes involve:
(a) depositing dielectric materials onto the template material, the template material for example comprising a semiconductor layer structure;
(b) depositing thin metal materials onto the dielectric layer;
(c) annealing the metal under controlled gas ambient temperature to form high density nano-masks;
(d) dry and wet etching the dielectric materials using metal nano-masks;
(e) dry and wet etching the semiconductor materials using the metal and dielectric nano-masks to form a high density of nanostructures.

Anodic porous alumina nano-mask fabrication processes involve:
(a) depositing dielectric materials onto the template material, template material for example comprising a semiconductor layer structure;
(b) depositing thin Al onto the dielectric layer;
(c) anodising the Al under controlled electrolyte, temperature and voltage to form high density anodic porous alumina nano-masks;
(d) depositing metal materials on to the alumina nano-masks;
(e) wet etching to remove the alumina nano-masks;
(f) dry and wet etching the semiconductor materials using the metal and dielectric nano-masks to form a high density of nanostructures.

Nano-imprint nano-mask fabrication processes involve:
(a) depositing dielectric materials onto the template material, the template material for example comprising a semiconductor layer structure;
(b) nano-imprinting and developing the nano-holes masks onto the dielectric materials;
(c) depositing thin metal materials onto the nano-holes masks;
(d) removing the nano-imprinted masks to form the periodically aligned metal quantum dots nano-masks;
(e) dry and wet etching the dielectric materials using metal nano-masks;
(f) dry and wet etching the semiconductor materials using the metal and dielectric nano-masks to form a high density of nanostructures.

In some cases, the template consists of a substrate only, i.e. without any semiconductor layer grown on top of the substrate. In such cases, the mask is fabricated directly onto the substrate.

In nano-imprint nano-mask fabrication technology, the "master" mask can be produced by methods such as interferometry, E-beam lithography, sub-micrometer photolithography, or x-ray lithography. The mask pattern can be custom-designed to consist of a photonic crystal structure, high symmetry photonic quasicrystal, gratings, and any other patterns for desired optical effects.

A dielectric material such as $SiO_2$ or $Si_3N_4$, which can be deposited by sputtering, e-beam evaporation or plasma-enhanced chemical vapour deposition (PECVD), may serve as the mask with the replicated pattern from the nano-masks produced by the above-mentioned technologies. The thickness of the dielectric layer depends on the etching selectivity between the dielectric materials and the semiconductor layers to be etched.

The nanostructures thus fabricated have an aspect ratio (i.e. height versus width) much larger than one. The etching process preferably etches the semiconductor layers off until the substrate is fully exposed. The layer structure is preferably grown in such a way that the lateral growth rate in the bottom and middle parts of the fabricated nanostructures is much smaller than that of the top part. One example of the layer structure of the nanostructures consists of layers such as substrate/AlN (~20 nm)/n-$Al_{0.03}Ga N_{0.97}$ (2 μm)/p-GaN (80 nm). The lateral growth rate of the GaN along the surface of AlN and n-$Al_{0.03}Ga N_{0.97}$ is much slower than that of p-GaN due to the slower diffusivity of Al in AlGaN and the possible presence of trace aluminium oxide.

The dimension of the nanostructures can be modified by further wet etching. Such treatment allows the fine tuning of the diameter of the nanostructures for optimized lateral overgrowth and ready separation of such grown thick freestanding compound semiconductor materials from the substrate.

A further ex-situ or in-situ nitridation can prevent the coalescence of the nanostructures in the root, hence maximizing the decoupling mechanism of the nanostructures to reduce the defect density and cracks of the top lateral-grown thick layers. One example of the layer structure of the nanostructures consists of layers such as (111)Si/amorphous AlN (~200 nm)/n-$Al_{0.06}GaN_{0.94}$ (~100 nm)/p-GaN (80 nm). The nanostructures may then be fabricated by etching down to expose about 500 nm Si. The nitridation process using $NH_3$ to convert Si into $Si_3N_4$ helps to prevent the lateral growth of GaN at the bottom of the nanostructures. The integrity of the voids between the nanostructures facilitates the formation of low stress and low defect density top layers during the subsequent lateral epitaxial growth.

Any further growth to lengthen the nanostructures may be deposited using an HVPE method, or alternatively a CVD method, a MOCVD method or an MBE method.

The further grown nanostructures may be either un-doped, or doped with n- or p-type dopants.

The further grown nanostructures may be deposited with single doped or undoped material, or with the combination of un-doped and doped steps, or n-doped and p-doped steps.

In particular, the further grown nanostructures may include a p-type region proximate the growth surface. The inclusion of such a region may assist with removal of the overgrown semiconductor, for example when using an anodic electrochemical selective etch process.

The further grown nanostructures may comprise a material selected from the group consisting of GaN, AlN, InN, ZnO, SiC, Si, and alloys thereof.

An exemplary method in accordance with the invention utilizes HVPE to grow high quality flat and thick compound semiconductors onto foreign substrates using nanostructure compliant layers. Examples of suitable nanostructures include nanocolumns (also known as "nano-rods" or "nanowires") of substantially constant diameter along the majority of their length, or other structures, for example pyramids, cones or spheroids which have varying diameter along their major dimensions. For simplicity, the following description will discuss the use of nanocolumns, however it should be realised that other suitable nanostructures such as those mentioned above may be also be used, and indeed may be advantageous for certain applications. Nanocolumns of semiconductor materials can be fabricated on any foreign substrates with the initial compound semiconductor layers grown by MBE, CVD, MOCVD (MOVPE) or HVPE methods. Such nanocolumns may typically have a diameter of about 10 to 120 nm. Further growth of continuous compound semiconductor thick films or wafer can be achieved by epitaxial lateral overgrowth using MOCVD or HVPE. Compound semiconductor thick film and wafer bending due to the thermal expansion coefficient difference between the compound semiconductor materials and the substrate can be minimized by a balanced dimension of the nanocolumn and air gap, which functions to decouple the impact of the substrate. Thick and flat freestanding compound semiconductor films can therefore be grown using this technique. Nano-pendeo lateral overgrowth using these nanocolumns will minimize the defects on the top compound semiconductor thick film through the defects bending mechanism in the interface of nanocolumn and lateral grown layer. The small dimension of the nanocolumns will also minimize the facet tilt in the grain boundary of lateral overgrown layer. The controlled dimension of the nanocolumns and the localized stress between the nanocolumn and lateral-grown layer also allows the thick semiconductor, for example GaN, to be readily separated from the substrate during rapid cooling. An anodic electrochemical selective etch process for p-GaN can also be used to separate the GaN film from the substrate when the etched nanocolumns include a thin p-GaN top layer. The thick GaN may then undergo slicing, grinding, lapping, and polishing processes to produce polar and non-polar compound semiconductor wafers. Such produced GaN can be used as the seed for further growth of thick freestanding GaN because of the uniform crystal orientation from the centre to the edge of the wafer and low defect density. Hence the method can provide a very economical mass production technology for freestanding compound semiconductor materials.

The growth processes provided by the invention can be applied to the family of III-V nitride compounds, generally of the formula $In_xGa_yAl_{1-x-y}N$, where $0 \leq x \leq 1$, $0 \leq y \leq 1$, and $0 \leq x+y \leq 1$, or other suitable semiconducting nitrides. Group II-VI compounds may also be suitable for production through the methodology of the present invention. The semiconductor may for example comprise materials such as GaN, AlN, InN, ZnO, SiC. Throughout the following description, the invention is described using GaN as an example of an epitaxial III-V nitride layer as the semiconductor material for convenience, though any suitable semiconducting material may be used.

The hydride-vapour phase epitaxy (HVPE), also called chloride transport chemical vapour deposition, of GaN is a relatively well-established process based on the gaseous transport of the group III and group V elements to the deposition zone of a growth reactor. In this technique Cl is used to transport the group-III species instead of organometallic sources in the MOCVD technique. This has a distinct advantage in that large growth rates (up to 200 µm/hr) can be achieved by this technique over the MOCVD or the MBE methods ($\leq 2$ µm/hr). In contrast to MOCVD, which is a non-equilibrium cold-wall reactor-based technique, HVPE is a reversible equilibrium-based process in which a hot-wall reactor is employed. The typical growth procedure is as follows. Sapphire, silicon carbide, zinc oxides or other compatible substrates are inserted into the deposition zone of the growth chamber and heated. When the final growth temperature is reached the $NH_3$ flow is started. After a period to allow the $NH_3$ concentration to reach a steady-state value, HCl flow is started to provide transport of the gallium chloride (GaCl), which is synthesized by reacting HCl gas with liquid Ga metal in the Ga zone at 800-900° C. via the reaction: $2HCl(g)+2Ga(l) \rightarrow 2GaCl(g)+H_2(g)$. An alternative method of synthesis is by reacting Chlorine gas with Ga metal around 125° C. Then gaseous GaCl is transported from the Ga zone to the deposition zone to react with $NH_3$ at 900-1200° C. to form GaN via the reaction $GaCl(g)+NH_3(g) \rightarrow GaN(s)+HCl(g)+H_2(g)$. The thickness of deposited GaN layer using this technique is typically up to 800 µm. Another major advantage of the HVPE growth method is the mutual annihilation of mixed dislocations lowering the defect densities in thick GaN. These characteristics make HVPE an ideal technology for manufacturing freestanding GaN and other related III-V nitrides substrates at low cost.

The growth temperature in the HVPE method is rather high (~1000° C.) and, hence, one major problem of growing thick GaN film using conventional methods is the possibility of cracks and lattice defects due to the use of foreign substrate, for example sapphire. It follows that there may also be mismatch in the lattice constants and thermal expansion coefficient between the GaN layer and the substrate).

The present invention provides a method for growing flat, low defect density, and strain-free thick semiconductor on any foreign substrates using a fabricated nanostructure compliant layer with an HVPE growth process. The use of fabricated GaN nanocolumns, for example, as the compliant layer to grow thick GaN has several advantages. The mechanical confinement occurs between the interface of the nanocolumns and top lateral grown layer due to the small diameter and the high aspect ratio of the column (height versus diameter). The stress and dislocations are mostly localized in the interface between the GaN nanocolumns and the top lateral grown layer. Thus growth leads to the top lateral overgrowth layer being nearly free of stress and dislocations. The topography of nanocolumns with a narrow air gap permits coalescence with a very thin overgrown layer. Typically only ~0.2 µm thickness is required for continuous overgrown GaN layers. This narrow air gap will also facilitate the very fast coalescence to form continuous AlN by the epitaxial lateral overgrowth of AlN onto these nanocolumns. With all the advantages described above, high-quality thick GaN can therefore be grown on this fabricated nanocolumn compliant layer, and has very little tilting in the coalesced front either on top of the nanocolumns or on top of the air gap in comparison with other ELOG or Pendeo processes.

GaN wafer bending due to the thermal expansion coefficient difference between the GaN and the substrate is also minimized by a balanced dimension of the nanocolumn and air gap, which functions to decouple and to relax the biaxial strain. Thick and flat GaN films can therefore be grown using this technique, including so-called GaN "boules" which may be sufficiently thick to be sliced into multiple wafers. Localized stress between the nanocolumn and top lateral overgrown layer also allows the thick GaN to be readily separated from the substrate during the rapid cooling, particularly if a tensile-stressed thin layer is grown between the fabricated nanocolumn and the substrate. An anodic electrochemical selective etch process for p-GaN can also be used to separate the GaN film from the substrate. The thick GaN, i.e. a boule, may then undergo slicing, grinding, lapping, and polishing processes as appropriate to produce standard thickness (~350 µm) GaN wafers in a process designed to produce commercial quantities. A wafer produced in this way may be used as the seed for a further process in accordance with the present invention.

The nanocolumns are fabricated using a template with a semiconductor layer which may be grown by MBE, MOCVD (such as metalorganic vapour phase epitaxy (MOVPE)), sputtering, HVPE, or any other semiconductor growth methods onto a substrate. The template can be made of a simple layer, or of the heterostructure, or of superlattices consisting of n- and p-type doped and un-doped semiconductors such as AlN, $Al_xGa_{1-x}N$ with $1>x>0$, GaN, $In_xGa_{1-x}N$ with $1>x>0$. The total thickness of the grown semiconductor layers is preferably less than 3 µm. Examples of such templates can be substrate/AlN (~20 nm)/GaN (1-3 µm), substrate/AlN (~20 nm)/AlGaN (1-3 µm)/GaN (10-100 nm), substrate/AlN (~20 nm)/AlGaN (1-3 µm)/InGaN (10-100 nm)/GaN (10-100 nm), substrate/GaN/(AlGaN 2.5-10 nm/GaN 2.5-10 nm superlattices), substrate/GaN/(AlGaN 2.5-10 nm/AlN 2.5-10 nm superlattices)/GaN (10-100 nm), substrate/GaN/(InGaN 2.5-10 nm/GaN 2.5-10 nm superlattices)/GaN (10-100 nm), substrate/$Si_3N_4$/AlN (~20 nm)/GaN (1-3 µm)/p-GaN (10-100 nm).

The dielectric material such as $SiO_2$ or $Si_3N_4$ which can be deposited by sputtering, e-beam evaporation, and plasma-enhanced chemical vapour deposition (PECVD), will serve as the mask, with the replicated pattern from the nanomasks produced by the above mentioned technologies. The thickness of the dielectric layer depends on the etching selectivity between the dielectric materials and the semiconductor layer(s).

Dry etching of the semiconductor layer(s) may be carried out by reactive ion etching (RIE) or inductively coupled plasma etching (ICP) using Ar, $Cl_2$, $BCl_3$, or $H_2$ gas mixtures. The preferred etch depth is to etch down to reach the substrate. Further wet etching using different acids and bases allows the fine tuning of the nanocolumn dimensions.

In situ or ex situ nitridation of the nanocolumns can be performed to reduce the coalescence of the nanocolumns during lateral overgrowth, to consequently maintain the integrity of the nanocolumns for decoupling the thermal expansion difference between the substrate and the lateral overgrown layer.

The fabricated III-Nitrides nanocolumn templates can be loaded for the initial thin continuous GaN epitaxial lateral overgrowth (ELOG) using MBE, MOCVD or HVPE. The thus-prepared templates can then be loaded for the thick GaN ELOG growth using HVPE. The observed evolution of the ELOG GaN morphology is sensitive to the growth parameters, in particular the temperature and pressure. This infers that the ELOG morphology can be seriously affected by the temperature distribution across the wafer, with resulting differences in the height and morphology of ELOG GaN. Thus temperature uniformity is a strong requirement for HVPE growth. The substrate holder may also be equipped with a rotation mechanism to maintain the same distance between the gas outlet and the substrate surface. Process parameters such as reactor temperature, pressure, total gas flow and V/III ratio may be systematically varied for the growth of thick, flat films.

The separation of the grown GaN can be achieved by the following methods. In brittle materials such as sapphire and III-V nitrides, cracking may occur easily when the stress exceeds a critical value. The fabricated III-nitrides nanocolumns with their high aspect ratio and nano-dimensions, will facilitate the cracking mechanism between the substrate and the top thick GaN due to the large difference of the thermal expansion coefficient, particularly when rapid cooling is carried out after the growth. A further mechanical twisting will push the local stress to exceed the critical value to separate the thick film. Another method of separating the GaN from the substrate is to use anodic electrochemical etching. In this case, a thin p-GaN layer is deposited at the top of the semiconductor layers. Nanocolumns with a p-GaN tip may be fabricated by the etching processes. Using a suitable electrolyte and bias voltage results in p-GaN being selectively etched off, to leave the thick top GaN (undoped or n-doped) untouched. Wet chemical etching using $H_3PO_4$ or KOH at high temperature is also very effective in etching off the AlN (especially amorphous AlN) and Si nanocolumns.

The same growth method described above can also be applied to the growth of other compound semiconductors. For example, thick, flat, and low defect AlN and AlGaN can be grown using $AlCl_3$ precursors formed by passing HCl through Al. AlN is very difficult to coalesce under normal ELOG growth technique, but using a nano-column compliant layer with nano-size air-gap in accordance with the present invention will facilitate the very fast coalescence for AlN and AlGaN.

If a γ-plane sapphire substrate is used, non-polar a-plane GaN can be grown using the nano-column compliant layers, and m-plane GaN can be grown on (100) LiAlO2, m-plane 4H— or 6H—SiC using the nano-column compliant layers.

Spectroscopic reflectance (SR) allows the measurement of the superposition of lateral interference and vertical interference which can provide both strain and thickness information on the layers. Reflectance measurements at the same wavelength as pyrometry allow the determination of the actual emissivity of the wafer, which in turn enables measurement of the true temperature of the wafer. SR can also help to measure and define the stage of the formation of 3D nucleation islands and the coalescence in the nanocolumn and ELOG growth process. This is essential for the control of nanocolumns and thick film growth.

BRIEF DESCRIPTION OF THE DRAWINGS

Specific embodiments of the invention will now be described with reference to the accompanying drawings, in which.

DETAILED DESCRIPTION

To illustrate the invention more clearly, various practical examples using techniques in accordance with the methods of the present invention are described below:

Example 1

Figure 1:
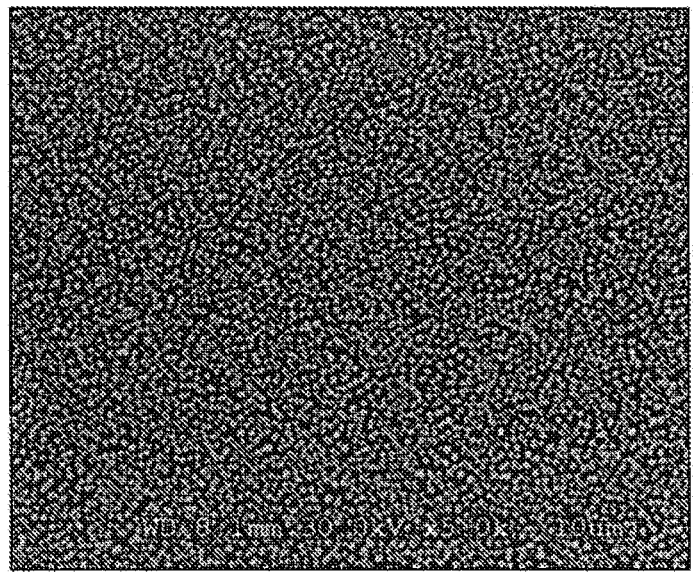
FIG. 1 shows annealed high density Ni nanodots.
Figure 2:
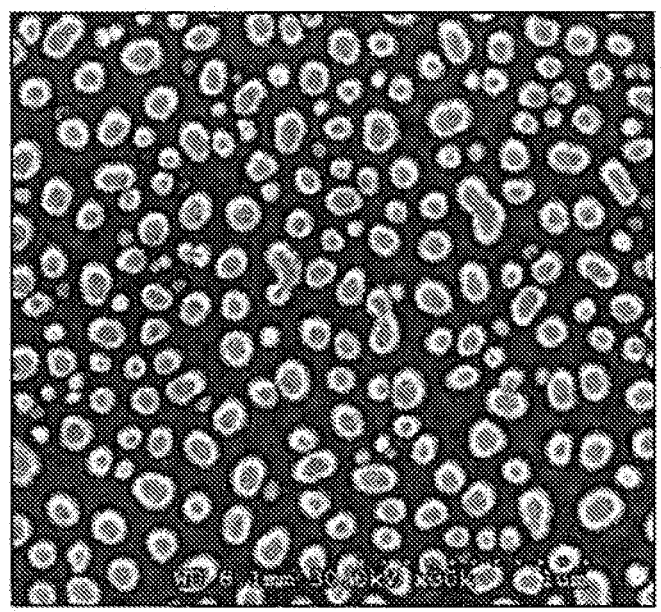
FIG. 2 shows a top view of etched GaN nanocolumns.
Figure 3:
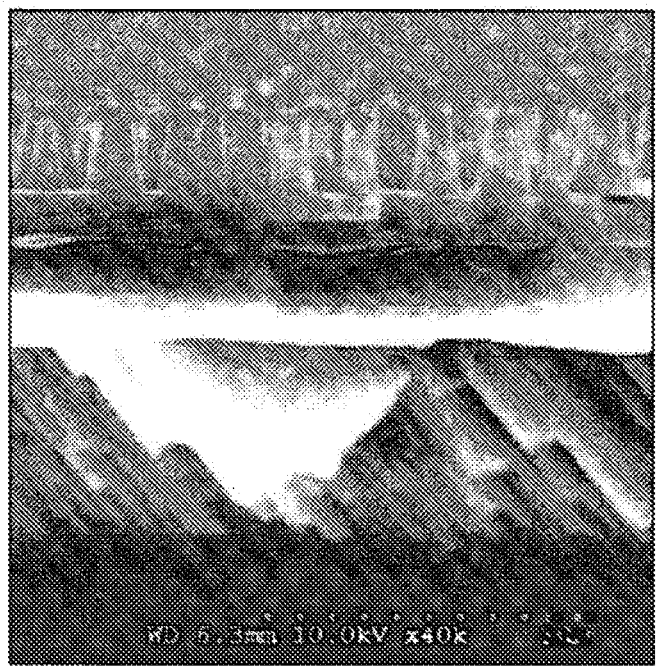
FIG. 3 shows a cross-sectional view of etched GaN nanocolumns.
Figure 4:
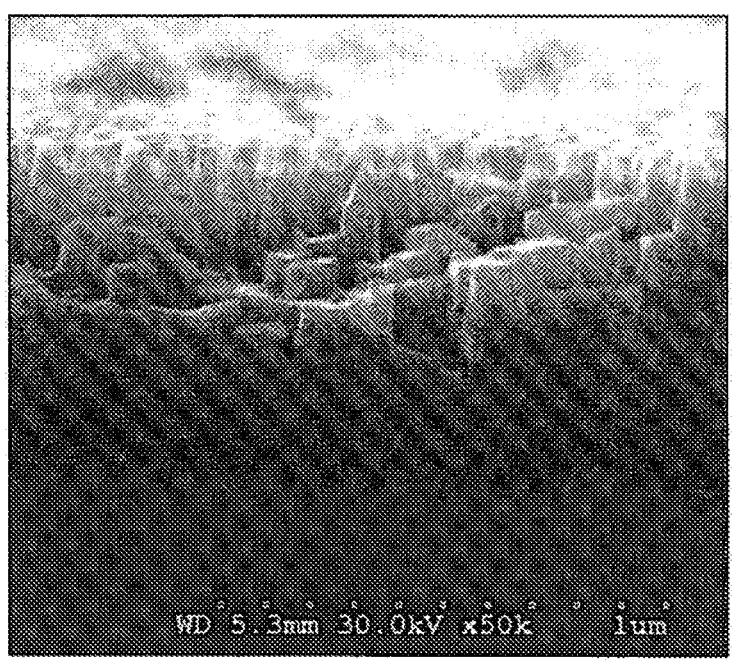
FIG. 4 shows a cross-sectional view of etched GaN nanocolumns of different dimensions.

A c-plane-oriented sapphire substrate of about 2 inches (5.08 cm) in diameter with MOCVD-deposited GaN of about 2-3 μm is loaded onto the substrate holder of a HVPE vertical reactor. Before loading, the GaN template is degreased in KOH for a few seconds, rinsed in deionized water, etched in a $H_2SO_4/H_3PO_4=3:1$ solution at 80° C. for a few minutes, then rinsed in deionized water. It is then necessary to create a mask onto the template. Firstly, a thin dielectric layer of $SiO_2$ or $Si_3N_4$ of ~200 nm is deposited by PECVD onto the GaN template. Then, a thin Ni metal layer of 2-6 nm is deposited by e-beam evaporation or sputtering onto the dielectric layer. Rapid annealing of the metal under $N_2$ gas at an ambient temperature of ~830° C. for about one minute is carried out to form a high density of Ni nano-dots, as shown in FIG. 1, forming the nano-mask. The thickness of the Ni metal allows the control of the density and the dimension of the Ni nano-dots. The next stage is to create the nanocolumns. Reactive ion etching (RIE) using Ar and $CHF_3$ is used to etch the dielectric materials using the Ni nano-dots. Then ICP etching using a gas mixture of Ar, $H_2$, $Cl_2$, or $BCl_3$ is carried out to etch GaN materials using the metal and dielectric nano-mask to form a high density of nanocolumns, as shown in FIGS. 2, 3, and 4.

Residual Ni nano-dots are removed using HCl solution. Residual dielectric materials of $SiO_2$ or $Si_3N_4$ are removed by buffered oxide etch solution and phosphoric acid respectively. Further wet etching using KOH is used to fine tune the dimension of the nanocolumns.

Figure 5:
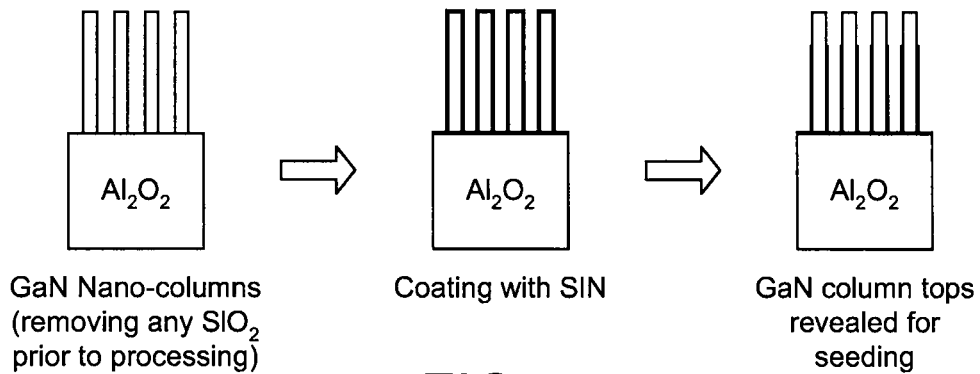
FIG. 5 is a schematic drawing of the nitridation process on GaN nanocolumns.
Figure 6:
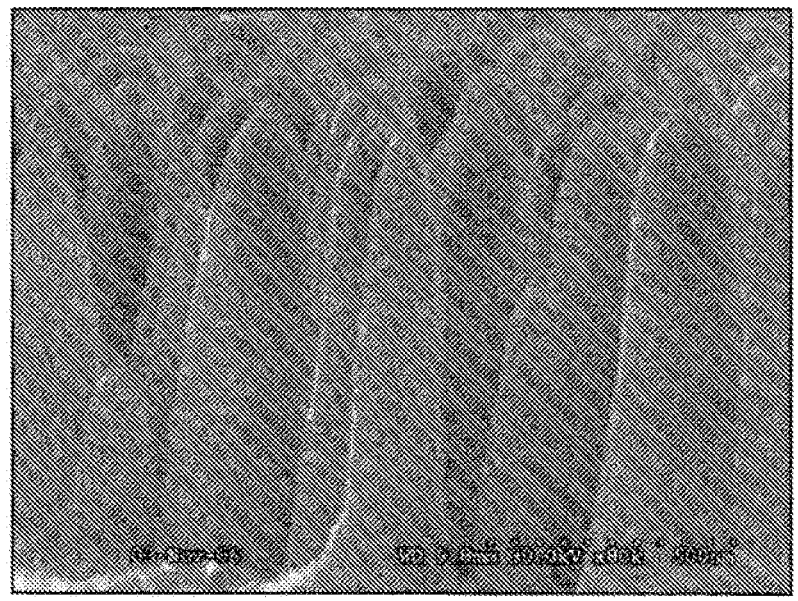
FIG. 6 shows a cross-sectional view of the GaN nanocolumns after nitridation.

An ex-situ nitridation process is carried out using PECVD with silane and $NH_3$ gas, as shown in FIG. 5. The nitridated surface has an anti-surfactant effect which inhibits the lateral growth of GaN. Using nitridation on nanocolumns therefore prevents quick coalescence in the root of the nanocolumns, which would destroy the de-coupling mechanism possible by using nanocolumns. The tip of the nitridated nanocolumns is slightly etched off by RIE. The GaN nanocolumns produced are shown in FIG. 6.

Figure 7:
FIG. 7 shows a cross-sectional view of the high quality ELOG grown GaN on GaN nanocolumns using a scanning electron microscope (SEM)
Figure 8:
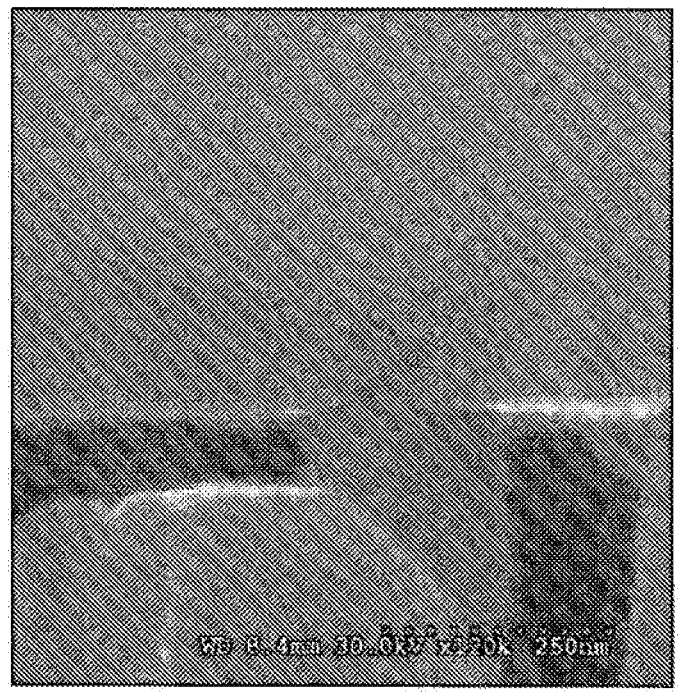
FIG. 8 shows a detailed and enlarged SEM cross-sectional view of ELOG-grown GaN on GaN nanocolumns.

The initial epitaxial lateral overgrowth is carried out by the MOCVD growth process. The nitridated GaN nanocolumn template is loaded into the reactor. The substrate temperature is then raised to about 1020° C. with the $NH_3$ flow of about 2000 sccm and Trimethylgallium (TMG) flow to about 5 sccm. After about 60 minutes growth, the TMG flow is set to about 10 sccm for about 20 minutes' growth, then to about 20 sccm for about 30 minutes' growth. The continuous GaN is fully coalesced within about the first 60 minutes. FIG. 7 shows an SEM cross section view of the high quality ELOG-grown GaN on GaN nanocolumns, with FIG. 8 showing the same view but in higher detail.

The ELOG-grown GaN template is then loaded into the HVPE reactor for the bulk GaN growth. The gas heater is heated to temperature of about 500° C. The pressure of the growth chamber is maintained at about 200 mbar. $N_2$ is introduced through all gas injectors for about 30 minutes to purge the reactor. The ELOG GaN templates is heated to about 350° C. $NH_3$ flow at about 1000 sccm is introduced into the chamber. The GaCl gas precursor is produced by passing about 10% HCl in $N_2$ through a Ga bubbler heated to about 800° C. The conversion rate is nearly 100% for GaCl. Then the template is heated to a temperature of about 1050° C. The pressure of the growth chamber is raised to about 300 mbar. Gas delivery to the growth chamber is set as follows for the growth process: $NH_3$ flow at about 2500 sccm, GaCl flow at about 60 sccm and $N_2$ and $H_2$ to make the rest of the gas. A steady total gas flow of about 3500 sccm is maintained throughout the whole growth process. The growth continues until a GaN epitaxial layer of sufficient thickness is produced. During the growth, the template is rotated to maintain the substantially constant distance between the gas outlets and the surface of the bulk GaN. For a growth with the V/III ratio set between 10 and 40 in the vertical HVPE reactor, a growth rate of between about 20-160 μm/hour can be achieved. Uniformity of the growth without the aided rotation is better than 2% from edge to edge in a 2 inch (5.08 cm) wafer.

In the nitride growth termination, GaCl gas is switched off, the flow of $NH_3$ is maintained at the same level and $N_2$ flow is increased to make up the steady total gas flow. The substrate cool-down is very fast at the first stage between 1050° C. and 500° C. The flow of $NH_3$ is then switched off below the temperature of 500° C. The cool-down continues with a rate faster than 100° C./min between 500° C. and room temperature. During this time, the gas heater maintains the temperature at about 150° C. and the substrate is lowered down from the chamber to obtain fast cooling-down.

Once the substrate is cooled and removed from the reactor, the sapphire substrate can be seen totally or partially separated from the thick GaN epitaxial layer. A further mechanical twist is sufficient to separate the partially separated GaN layer.

Figure 9:
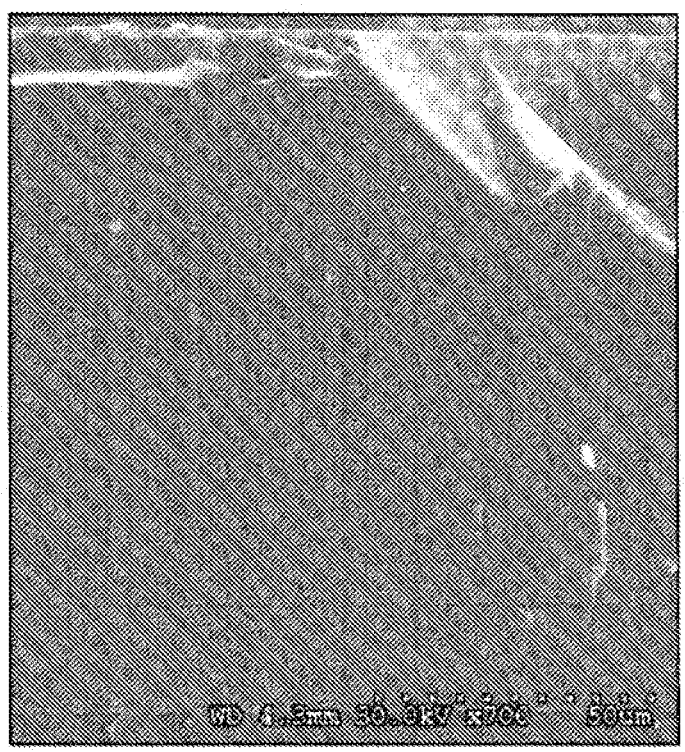
FIG. 9 shows an SEM cross-sectional view of bulk growth GaN on GaN nanocolumns.
Figure 10:
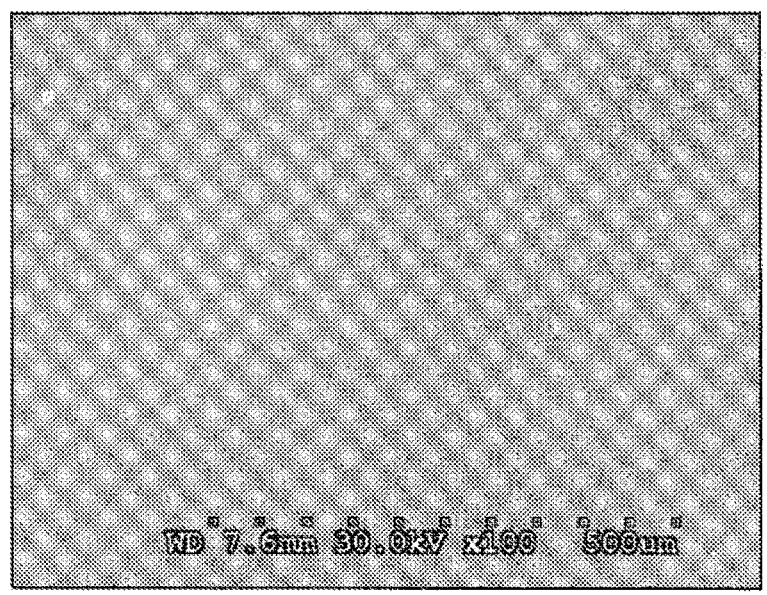
FIG. 10 shows a plan view of bulk GaN on GaN nanocolumns.
Figure 11:
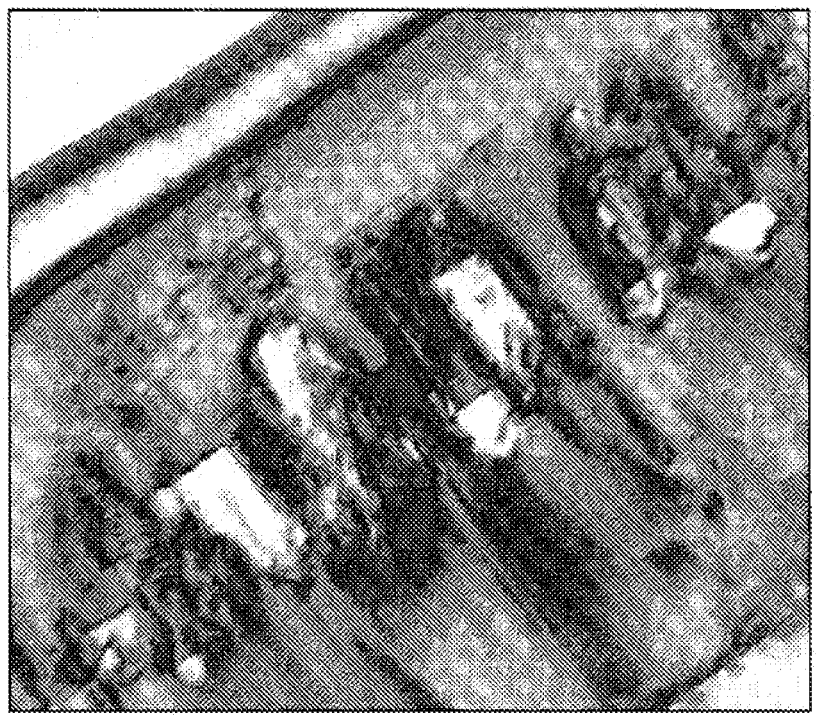
FIG. 11 shows a cross-sectional transmission electron microscope (TEM) view of bulk GaN on GaN nanocolumns.

FIG. 9 shows a SEM cross-sectional view of the high-quality bulk growth GaN on GaN nanocolumns, where many of the nanocolumns can be seen to crack. FIG. 10 shows a plan view of the high-quality bulk GaN on GaN nanocolumns. FIG. 11 shows a high resolution cross-section TEM image of the high-quality bulk GaN on GaN nanocolumns. The image clearly shows that very few threading dislocations are observed on the top ELOG and bulk-growth GaN. There are some stacking faults parallel to the growth surface of the ELOG GaN near GaN nanocolumns, but the nano-pendeo growth bends all defects strongly at the interface of ELOG GaN and nanocolumns. Therefore the bulk GaN contains very few defects.

Figure 12:
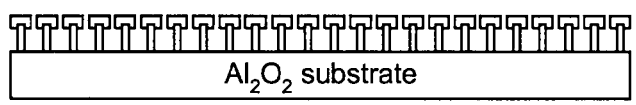
FIG. 12 is a schematic drawing of the initial ELOG and bulk growth processes on nitridated GaN nanocolumns.
Figure 12:
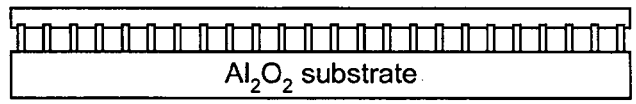
Figure 12:
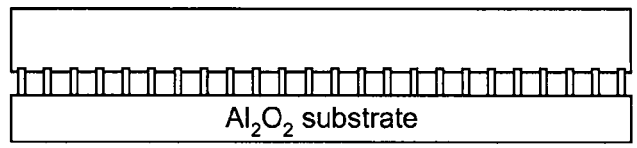

FIG. 12 shows a schematic drawing of the initial ELOG and bulk-growth processes on nitridated GaN nanocolumns, in which the initial ELOG and coalescence are carried out using MOVPE, with the bulk over-growth performed using HVPE.

Example 2

This Example is similar to Example 1, except that here the nitridation is carried in-situ within the MOCVD reactor. A surface nitridation step is carried out for about 2 minutes with the reactor pressure at about 100 mbar, substrate temperature about 890-1000° C., and Silane flow at about 3 sccm and $NH_3$ flow at about 1200 sccm.

Example 3

Figure 13:
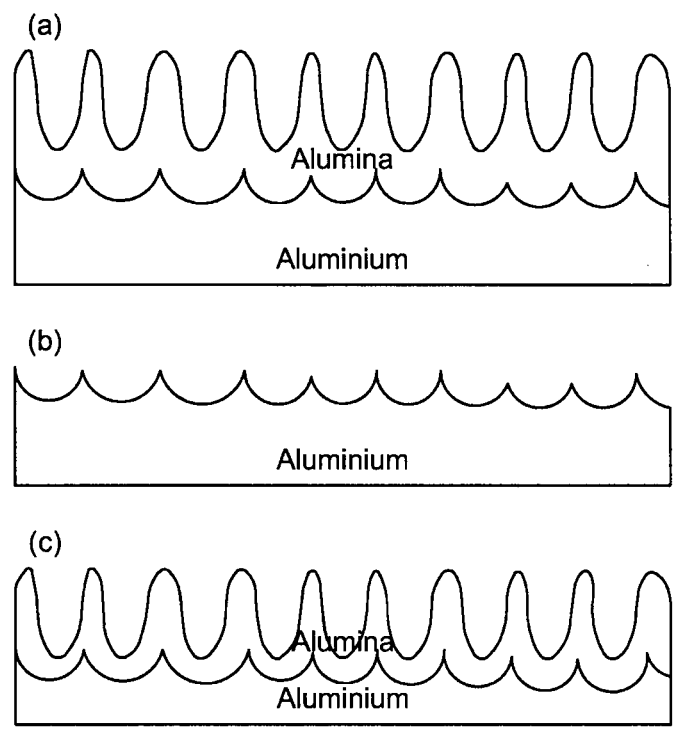
FIGS. 13a-c schematically show a two step anodization process to fabricate nano-masks.
Figure 14:
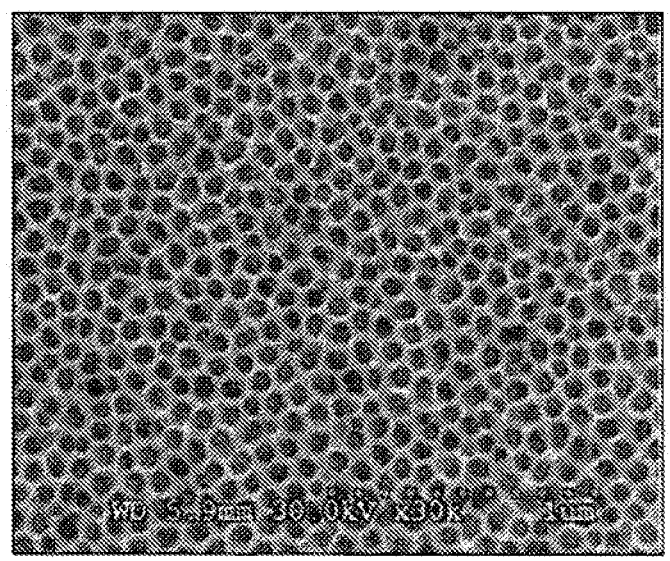
FIG. 14 shows a top view of an anodic porous alumina pattern on top of the III-nitrides template.
Figure 15:
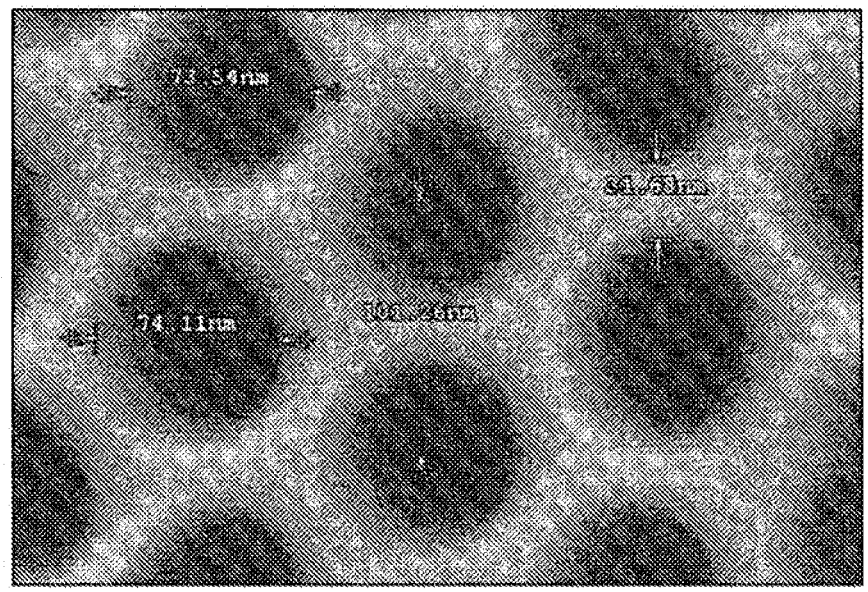
FIG. 15 shows an anodic porous alumina pattern on top of the III-nitrides template, marked with dimensions.
Figure 16:
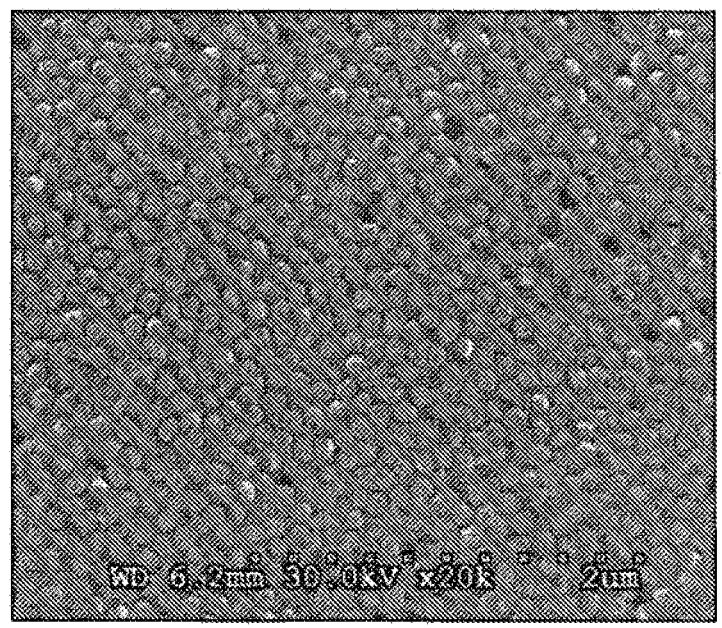
FIG. 16 shows a top view of Ni quantum dots after etching away an anodic porous alumina pattern on top of the III-nitrides template.

This Example is similar to Example 1, except that here the GaN nanocolumns are made using anodic porous alumina nano-mask fabrication processes. A c-plane-oriented sapphire substrate of about 2 inches (5.08 cm) in diameter with MOCVD deposited GaN of 2-3 μm is loaded onto the substrate holder of the HVPE vertical reactor. Before loading, the GaN template is degreased in KOH for a few seconds, rinsed in deionized water, etched in a $H_2SO_4/H_3PO_4$=3:1 solution at about 8° C. for a few minutes, then rinsed in deionized water. A thin dielectric layer of $SiO_2$ or $Si_3N_4$ of ~200 nm is deposited by PECVD onto the GaN template. Then a thin Al metal of about 60-200 nm is deposited by e-beam evaporation or sputtering onto the dielectric layer. A two step anodization process is used, as schematically shown in FIGS. 13a-c. A first anodization (FIG. 13a) is conducted under 0.3 M oxalic acid solution at 5° C. with current ~100 mA and 20 V for about 6 hours to form a layer of oxide (alumina) on top of the aluminium layer. The surface texture of the aluminium is changed by the anodization process to produce concavities as shown. Then the oxide is removed by a mixture of about 6 wt % $H_3PO_4$ and 1.8 wt % $H_2CrO_4$ at about 60° C. for 1-1.5 hours (FIG. 13b). A second anodization (FIG. 13c) is conducted under the same oxalic solution at ~100 mA and 40 V for about 5 hours. The second anodization is required to create a more uniform nano-mask pattern. Trace aluminium may then be removed from the alumina layer. 5 wt % $H_3PO_4$ is used to smooth and enlarge the pores of the anodic porous alumina. FIG. 14 shows the anodic porous alumina pattern on top of the template following the two step anodization process. FIG. 15. shows an enlarged section with marked dimension for the pores and walls of 74 nm and 32 nm respectively. Then a thin Ni metal of 4-10 nm is deposited by e-beam evaporation or sputtering onto the pores of the anodic porous alumina. 5 wt % $H_3PO_4$ is then used to remove all alumina. FIG. 16 shows the Ni quantum dots after etching away the anodic porous alumina pattern on top of the III-nitrides template.

Figure 17:
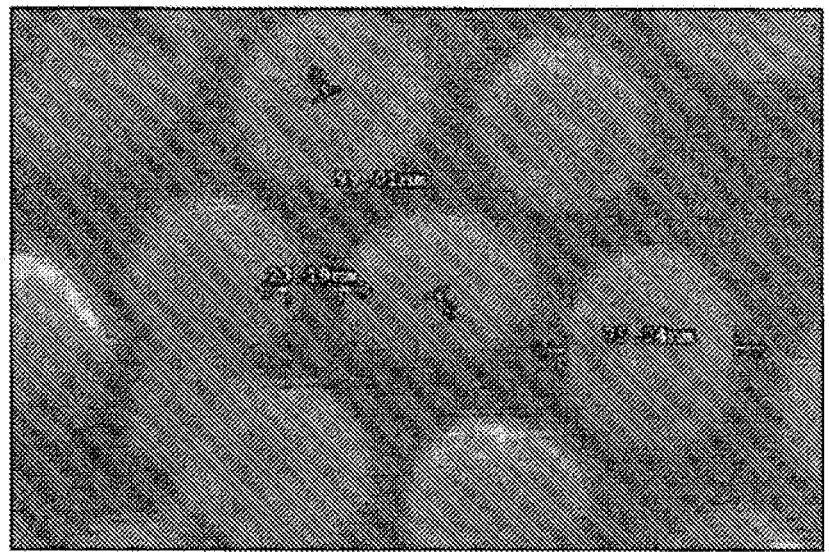
FIG. 17 shows Ni quantum dots after etching away an anodic porous alumina pattern on top of the III-nitrides template, marked with dimensions.

FIG. 17 shows an enlarged view of the Ni quantum dots of ~75 nm. Reactive ion etching (RIE) using Ar and $CHF_3$ is used to etch the dielectric materials using Ni nano-dots. Then ICP etching using a gas mixture of Ar, $H_2$, $Cl_2$, or $BCl_3$ is carried out to etch GaN materials using the metal and dielectric nano-masks to form a high density of nano-columns.

Figure 18:
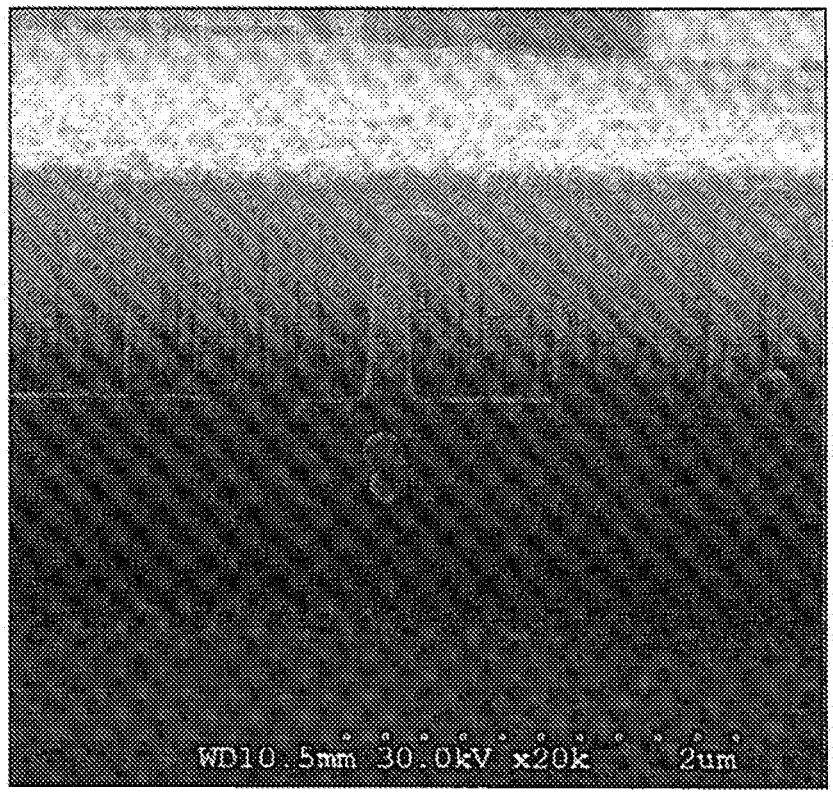
FIG. 18 shows a cross-sectional view of GaN nanocolumns after dry etching using Ni quantum dots deposited in the anodic porous alumina pattern.

Residual Ni nano-dots are removed using HCl solution. Residual dielectric materials of $SiO_2$ or $Si_3N_4$ are removed by buffered oxide etch solution and phosphoric acid respectively. Further wet etching using KOH may fine tune the dimension of the nanocolumns. FIG. 18 shows the GaN nanocolumns after dry etching using Ni nano-dots deposited on to the pores of the anodic porous alumina pattern.

Example 4

Here, the initial MOCVD epitaxial lateral overgrowth process described in Example 1 is replaced by a pulsed HVPE growth method. In this method, the flow sequence of reagent gases is on ($NH_3$ and GaCl on) and off (GaCl on and $NH_3$ off) in turn for the enhanced lateral growth mode. The time for the on and off period is set to be around 60 seconds and 15 seconds respectively. The GaN growth step is continued until a continuous GaN epitaxial layer is produced. For the growth with the V/III ratio set between 10 and 40 in the vertical reactor, a growth rate of around 30-120 μm/hour can be achieved.

Example 5

In this Example, the thick n-type doped GaN is grown on the nanocolumns template, wherein the nanocolumns are tipped with a thin p-GaN top layer. The thick n-GaN is separated from the substrate using an electrochemical method. The thick n-GaN acts as the anode, a Pt mesh is used as the cathode and either KOH or $H_3PO_4$ is used as the electrolyte. A bias voltage (to Pt reference electrode) of about 3.5 to 4 V is applied to selectively etch away the p-GaN. The thick n-GaN is typically separated from the substrate after about 30 minutes etching.

It will be apparent to those skilled in the art that a wide range of methods and process parameters can be accommodated within the scope of the invention, not just those explicitly described above. For example, nanocolumns may be fabricated in a variety of ways, which will be apparent to those skilled in the art. The mask for example may be produced using any suitable method, and not just those listed in detail above. The nanocolumns may be fabricated so as to have various shapes of tips, chosen as appropriate for the application in hand. The material of the nanocolumns does not have to be constant, for example the alloy content may be varied along its height so that its properties are most suitable for the specific application. For example, the alloy content may be selected so as to optimise absorption during a laser ablation separation process. Alternatively, a change in the alloy content may optimise the lattice constant for the overgrown semiconductor. Furthermore, the nanocolumn material need not be identical to that of the overgrown compound semiconductor.

In the specific examples described, nanocolumns are fabricated from the semiconductor template before overgrowth of the semiconductor material. However, use of a nanocolumn layer may permit relatively easy removal of the semiconductor, without causing undue damage to the underlying substrates. The semiconductor material can then be prepared to be used as the seed for further growth of the semiconductor material by HVPE. The full benefit of the defects annihilation in HVPE growth can be used to achieve the semiconductor material with the lowest defect by the use of a previously-grown semiconductor as the seed. In other words, the nanocolumn fabrication processes may need to be done only once, then the semiconductor may be used as a seed for the overgrowth of semiconductor materials. This would have significant cost savings for the second and each subsequent overgrowth.

What is claimed is:

1. A method of producing a single-crystal semiconductor material, comprising the steps of:
   (a) providing a template material comprising a layer of semiconductor material;
   (b) creating a mask on top of the template material, the mask comprising at least one nano-dot of mask material;
   (c) etching the template material using the mask to form at least one etched nanostructure in the template material, the at least one etched nanostructure being formed from template material located underneath the at least one nano-dot; and
   (d) growing the single-crystal semiconductor material onto the at least one nanostructure,
   wherein each nanostructure comprises a nanocolumn,
   wherein the method further comprises the step of subjecting the nanostructures to a nitridation process, the nitridation process preventing the lateral growth of semiconductor material at the bottom of the structures.

2. A method according to claim 1, wherein the template material comprises a substrate.

3. A method according to claim 2, wherein the semiconductor layer is formed by deposition onto the substrate by epitaxial growth methods.

4. A method according to claim 2, wherein the substrate comprises a material selected from the group consisting of sapphire, silicon, silicon carbide, diamond, metals, metal oxides, compound semiconductors, glass, quartz and composite materials.

5. A method according to claim 2, wherein the substrate comprises a single crystal material with a specific crystal orientation.

6. A method according to claim 5, wherein the substrate crystal orientation is selected to determine whether the single-crystal semiconductor material is polar or non-polar.

7. A method according to claim 2, wherein the etching is used to remove part of the substrate.

8. A method according to claim 1, wherein the template material semiconductor layer is selected from the group consisting of p-type doped, n-type doped or undoped III-V and II-VI compounds, and metal oxides.

9. A method according to claim 8, wherein the template material semiconductor layer comprises a simple layer, or multiple layers, or the heterostructure, or superlattices of the III-V or II-VI compounds.

10. A method according to claim 8, wherein the template material semiconductor layer comprises one of AlN, $Al_xGa_{1-x}N$ with $1>x>0$, GaN, or $In_xGa_{1-x}N$ with $1>x>0$.

11. A method according to claim 1, wherein the template material comprises a top layer of p-GaN.

12. A method according to claim 1, wherein step (b) includes depositing a layer of dielectric material onto the template material.

13. A method according to claim 12, wherein the mask is formed by imprinting onto the dielectric material using a nano-imprint method.

14. A method according to claim 12, wherein a layer of metal is applied onto the layer of dielectric material and the mask is formed by removing regions of the metal layer.

15. A method according to claim 1, wherein in step (b), the mask is created using one of metal annealing, anodic porous alumina, e-Beam lithography, interferometry, holography, photolithography or a nano-imprint method.

16. A method according to claim 1, wherein after etching, any remaining metal and/or dielectric material on the nanostructures is removed.

17. A method according to claim 1, wherein step (d) comprises laterally growing an initial layer of semiconductor material, then vertically growing the semiconductor material onto the initial layer.

18. A method according to claim 17, wherein the lateral growth of semiconductor material is carried out by a MOCVD, a MBE, an HVPE method or a pulsed growth method.

19. A method according to claim 17, wherein the vertical growth of semiconductor material is carried out by an HVPE method.

20. A method according to claim 1, wherein the single-crystal semiconductor material is either polar or non-polar.

21. A method according to claim 1, further comprising the step of:
   (e) separating the single-crystal semiconductor material from the nanostructures.

22. A method according to claim 21, wherein the single-crystal semiconductor material is separated from the nanostructures by a method selected from the group of rapidly cooling the material, wet etching, electrochemical etching, laser ablation, or by mechanical separation.

23. A single-crystal semiconductor material grown using the method according claim 1.

24. A semiconductor nanostructure formed by a method in accordance with claim 1.

* * * * *

UNITED STATES PATENT AND TRADEMARK OFFICE
CERTIFICATE OF CORRECTION

PATENT NO. : 8,828,849 B2
APPLICATION NO. : 12/307266
DATED : September 9, 2014
INVENTOR(S) : Wang Nang Wang It is certified that error appears in the above-identified patent and that said Letters Patent is hereby corrected as shown below:

In the Claims

Col. 16, line 55,   Delete "according claim",
Claim 23

Insert --according to claim--

Signed and Sealed this
Second Day of August, 2016

Michelle K. Lee
*Director of the United States Patent and Trademark Office*